(12) United States Patent
Kasper et al.

(10) Patent No.: US 10,634,628 B2
(45) Date of Patent: Apr. 28, 2020

(54) X-RAY FLUORESCENCE APPARATUS FOR CONTAMINATION MONITORING

(71) Applicant: BRUKER JV ISRAEL LTD., Migdal HaEmek (IL)

(72) Inventors: Nikolai Kasper, Rheinzabern (DE); Juliette P. M. van der Meer, Karlsruhe (DE); Elad Yaacov Schwarcz, Givatayim (IL); Matthew Wormington, Littleton, CO (US)

(73) Assignee: BRUKER TECHNOLOGIES LTD., Migdal Haemek (IL)

( * ) Notice: Subject to any disclaimer, the term of this patent is extended or adjusted under 35 U.S.C. 154(b) by 159 days.

(21) Appl. No.: 15/993,621

(22) Filed: May 31, 2018

(65) Prior Publication Data

US 2018/0348151 A1 Dec. 6, 2018

Related U.S. Application Data

(60) Provisional application No. 62/514,981, filed on Jun. 5, 2017.

(51) Int. Cl.
| | |
|---|---|
| *G01N 23/223* | (2006.01) |
| *H01L 21/67* | (2006.01) |
| *G01N 23/2204* | (2018.01) |
| *G01C 9/06* | (2006.01) |
| *H01L 21/687* | (2006.01) |

(Continued)

(52) U.S. Cl.
CPC ............ *G01N 23/223* (2013.01); *G01C 9/06* (2013.01); *G01N 23/2204* (2013.01); *H01L 21/67259* (2013.01); *H01L 21/67288* (2013.01); *H01L 21/681* (2013.01); *H01L 21/68764* (2013.01); *G01C 2009/066* (2013.01); *G01N 2223/303* (2013.01); *G01N 2223/32* (2013.01); *G01N 2223/6116* (2013.01); *H01L 22/12* (2013.01)

(58) Field of Classification Search
CPC ............. G01N 23/223; G01N 23/2204; G01N 2223/303; G01N 2223/32; G01N 2223/6116; G01C 9/06; G01C 2009/066; H01L 21/67259; H01L 21/67288; H01L 21/681; H01L 21/68764; H01L 22/12
USPC .......................................................... 378/44
See application file for complete search history.

(56) References Cited

U.S. PATENT DOCUMENTS

| | | |
|---|---|---|
| 4,675,892 A | 6/1987 | Plessis et al. |
| 4,953,189 A | 8/1990 | Wang et al. |
| 5,101,226 A | 3/1992 | Beaulieu et al. |

(Continued)

FOREIGN PATENT DOCUMENTS

| | | |
|---|---|---|
| DE | 102005029511 A1 | 12/2006 |
| WO | 2008149372 A2 | 12/2008 |

*Primary Examiner* — Courtney D Thomas
(74) *Attorney, Agent, or Firm* — Kligler & Associates Patent Attorneys Ltd

(57) ABSTRACT

An apparatus for X-ray measurement, includes an X-ray source, an X-ray detector, an optical inclinometer, and a processor. The X-ray source is configured to generate and direct an X-ray beam to be incident at a grazing angle on a surface of a sample. The X-ray detector is configured to measure X-ray fluorescence emitted from the surface of the sample in response to being excited by the X-ray beam. The optical inclinometer is configured to measure an inclination of the surface of the sample. The processor is configured to calibrate the grazing angle of the X-ray beam based on the measured inclination, and to further fine-tune the grazing angle based on the X-ray fluorescence measured by the X-ray detector.

32 Claims, 4 Drawing Sheets

(51) Int. Cl.
*H01L 21/68* (2006.01)
*H01L 21/66* (2006.01)

(56) References Cited

U.S. PATENT DOCUMENTS

| | | |
|---|---|---|
| 5,400,386 A | 3/1995 | Amemiya et al. |
| 5,432,831 A | 7/1995 | Nagai et al. |
| 6,512,814 B2 | 1/2003 | Yokhin et al. |
| 6,865,030 B2 | 3/2005 | Berto et al. |
| 7,106,832 B2 | 9/2006 | Klunder et al. |
| 7,269,245 B2 | 9/2007 | He et al. |
| 7,386,097 B2 | 6/2008 | Kerpershoek et al. |
| 7,406,153 B2 | 7/2008 | Berman et al. |
| 7,453,985 B2 | 11/2008 | Mazor et al. |
| 7,551,719 B2 | 6/2009 | Yokhin et al. |
| 7,977,258 B2 | 7/2011 | Nenyei et al. |
| 8,243,878 B2 | 8/2012 | Yokhin et al. |
| 8,693,635 B2 | 4/2014 | Krohmal |
| 8,731,138 B2 | 5/2014 | Yokhin et al. |
| 9,551,677 B2 | 1/2017 | Mazor et al. |
| 2008/0165922 A1 | 7/2008 | Yanoff et al. |
| 2015/0247811 A1 | 9/2015 | Yun et al. |
| 2018/0088062 A1 | 3/2018 | Mazor et al. |

X-RAY FLUORESCENCE APPARATUS FOR CONTAMINATION MONITORING

CROSS-REFERENCE TO RELATED APPLICATION

This application claims the benefit of U.S. Provisional Patent Application 62/514,981, filed Jun. 5, 2017, which is incorporated herein by reference.

FIELD OF THE INVENTION

The present invention relates generally to instruments for material and process analysis, and specifically to instruments and methods using X-rays for surface analysis of samples.

BACKGROUND OF THE INVENTION

A possible way to analyze a sample is to irradiate the sample with X-rays and measure a resulting signal. For example, U.S. Pat. No. 9,551,677, describes a method that includes directing an X-ray beam to be incident at a grazing angle on a location on a surface of the sample. X-ray fluorescence excited at the location is measured. A reflection angle of the X-ray beam from the surface, and a transmission angle of the X-ray beam, are measured. An angle of incidence of the X-ray beam on the surface is evaluated using the measured reflection and transmission angles, and the measured X-ray fluorescence is analyzed using the evaluated angle of incidence.

As another example, U.S. Pat. No. 7,551,719 describes an apparatus that includes a radiation source for analysis of a sample. The apparatus is adapted to direct a first, converging beam of X-rays toward a surface of the sample and to direct a second, collimated beam of the X-rays toward the surface of the sample. A motion assembly moves the radiation source between a first source position, in which the X-rays are directed toward the surface of the sample at a grazing angle, and a second source position, in which the X-rays are directed toward the surface in a vicinity of a Bragg angle of the sample. A detector assembly senses the X-rays scattered from the sample as a function of angle while the radiation source is in either of the first and second source configurations and in either of the first and second source positions. A signal processor receives and processes output signals from the detector assembly so as to determine a characteristic of the sample.

U.S. patent application Ser. No. 15/717,961 titled, "Closed-Loop Control of X-ray Knife Edge," filed Sep. 28, 2017, whose disclosure is incorporated herein by reference, describes an apparatus for X-ray scatterometry that includes an X-ray source, which directs an X-ray beam to be incident at a grazing angle on an area of a surface of a sample, and an X-ray detector measures X-rays scattered from the area. A knife edge is arranged parallel to the surface of the sample in a location adjacent to the area so as to define a gap between the surface and the knife edge and to block a portion of the X-ray beam that does not pass through the gap. A motor moves the knife edge perpendicular to the surface so as to control a size of the gap. An optical rangefinder receives optical radiation reflected from the surface and outputs a signal indicative of a distance of the knife edge from the surface. Control circuitry drives the motor responsively to the signal in order to regulate the size of the gap.

A possible way to increase the detection ability of an X-ray detector is to shield the detector against stray X-ray radiation. For example, U.S. Pat. No. 8,693,635 describes an X-ray detector assembly that includes an integrated circuit, which includes an array of detector elements and a readout circuit adjacent to the array and coupled to read charge out of the detector elements. A non-metallic shield is positioned over the readout circuit so as to prevent X-rays from striking the readout circuit.

In another field that uses X-rays, German Patent Application Publication DE102005029511 describes a device that comprises a screen consisting of at least two materials for absorbing X-ray radiation. Each X-ray radiation absorption coefficients of the materials differ in the energetic layer of their K-edges. An independent claim is also included for an X-ray device comprising a solid body detector and the above screen. Preferred Features: The screen consists of three materials whose X-ray radiation absorption coefficients differ in the energetic layer of their K-edges.

In yet another field that uses X-rays, U.S. Patent Application Publication 2008/0165922 describes a computed tomography (CT) collimator that includes a first radiation absorbent lamination having a plurality of apertures formed therethrough. Each aperture formed through the first radiation absorbent lamination is aligned with a respective axis formed between a corresponding pixelating element and an x-ray emission source. The collimator includes a second radiation absorbent lamination having a plurality of apertures formed therethrough, each aperture formed through the second radiation absorbent lamination aligned with the respective axis formed between a corresponding pixelating element and the x-ray emission source. A spacer is positioned between the first and second radiation absorbent laminations.

SUMMARY OF THE INVENTION

An embodiment of the present invention that is described herein provides an apparatus for X-ray measurement. The apparatus includes an X-ray source, an X-ray detector, an optical inclinometer, and a processor. The X-ray source is configured to generate and direct an X-ray beam to be incident at a grazing angle on a surface of a sample. The X-ray detector is configured to measure X-ray fluorescence emitted from the surface of the sample in response to being excited by the X-ray beam. The optical inclinometer is configured to measure an inclination of the surface of the sample. The processor is configured to calibrate the grazing angle of the X-ray beam based on the measured inclination, and to further fine-tune the grazing angle based on the X-ray fluorescence measured by the X-ray detector.

In some embodiments, the processor is further configured to detect contaminants on the sample based on the measured X-ray fluorescence.

In some embodiments, the processor is further configured to store in a memory a resulting calibration lookup table for the grazing angle.

In some embodiments, the processor is configured to fine-tune the grazing angle based on a measured X-ray fluorescence intensity of a given spectral line.

In an embodiment, the given spectral line is a fluorescence line of a chemical element that the sample comprises.

In an embodiment, the sample includes a silicon substrate, and wherein the given spectral line is a SiKα line.

In another embodiment, the processor is configured to determine the grazing angle from a stored calibration lookup table comprising fluorescence intensity of the given spectral line as a function of angle of incidence.

In some embodiments, the X-ray source includes multiple X-ray sources configured to excite X-ray fluorescence at multiple different X-ray energy bands. The X-ray detector includes multiple X-ray detectors configured to detect the X-ray fluorescence at respective multiple different X-ray energy bands.

In some embodiments, the apparatus further includes an additional X-ray detector, which is configured to measure X-rays that are specularly reflected by the sample at the grazing angle.

In an embodiment, the processor is further configured to recalibrate a zero-angle reference for the optical inclinometer based on the fine-tuning, and to store the calibrated zero-angle reference for later use at subsequent measurement sites on the sample or for use with subsequent samples.

In another embodiment, the apparatus further includes a multi-layer shield, which includes multiple layers, each layer configured to attenuate stray X-ray fluorescence radiation of progressively-increasing wavelength emitted toward the X-ray detector from a previous layer of the multi-layer shield.

There is also provided, in accordance with an embodiment of the present invention, an apparatus for X-ray measurement, including an X-ray source, an X-ray detector, and a multi-layer shield. The X-ray source is configured to generate and direct an X-ray beam to a surface of a sample. The X-ray detector is configured to detect X-ray fluorescence radiation emitted from the sample in response to being excited by the X-ray beam. The multi-layer shield includes multiple layers, each layer configured to attenuate stray X-ray fluorescence radiation of progressively-increasing wavelength emitted toward the X-ray detector from a previous layer of the multi-layer shield.

In some embodiments, a first layer of the multiple layers traversed by the X-ray beam is made of a light-weight metal, a second layer traversed by the X-ray beam is made of a heavy-weight metal, a third layer traversed by the X-ray beam is made of a medium-weight metal, and a fourth layer traversed by the X-ray beam is made of a light-weight metal.

In some embodiments, the multi-layer shield includes a plate mounted in front of a snout of the X-ray detector.

In an embodiment, the multi-layer shield protrudes below a lowest point of a snout of the X-ray detector.

In some embodiments, the apparatus further includes an optical inclinometer and a processor. The optical inclinometer is configured to measure an inclination of the surface of the sample. The processor is configured to calibrate the grazing angle of the X-ray beam based on the measured inclination, and to further fine-tune the grazing angle based on the X-ray fluorescence measured by the X-ray detector.

There is additionally provided, in accordance with an embodiment of the present invention, a method for X-ray measurement, the method including generating and directing an X-ray beam to be incident at a grazing angle on a surface of a sample. X-ray fluorescence, which is emitted from the surface of the sample in response to being excited by the X-ray beam, is measured. An inclination of the surface of the sample is measured. Based on the measured inclination, the grazing angle is calibrated, and, based on the measured X-ray fluorescence, the grazing angle is further fine-tuned.

There is also provided, in accordance with an embodiment of the present invention, a method for X-ray measurement, the method including generating and directing an X-ray beam to a surface of a sample. X-ray fluorescence radiation, which is emitted from the sample in response to being excited by the X-ray beam, is measured. Stray X-ray fluorescence radiation of progressively-increasing wavelengths emitted from a previous layer is attenuated using a multi-layer shield comprising multiple layers.

The present invention will be more fully understood from the following detailed description of the embodiments thereof, taken together with the drawings in which:

DETAILED DESCRIPTION OF EMBODIMENTS

Overview

Figure 1:
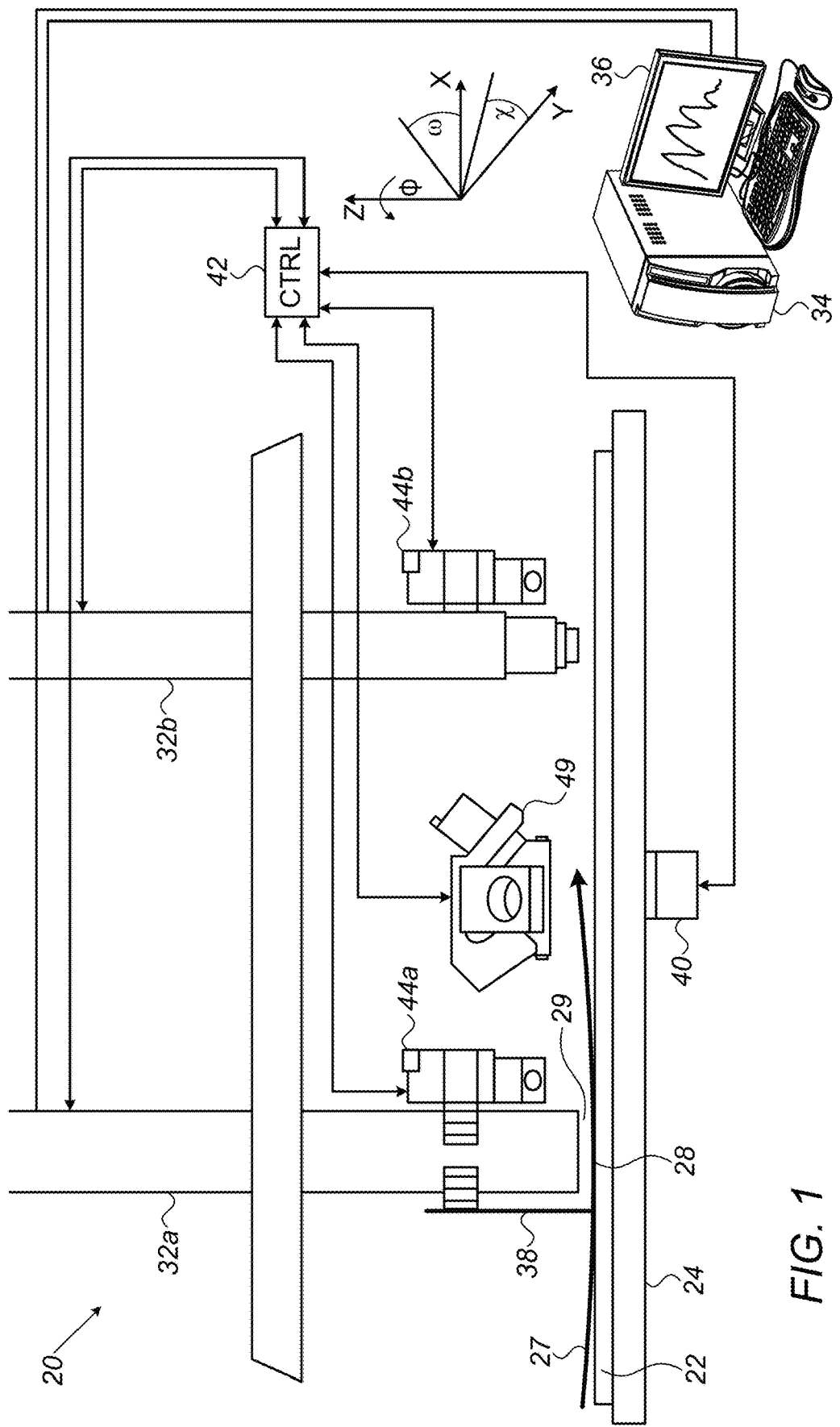
FIG. 1 is a schematic side view of a Total-Reflection X-ray Fluorescence (TRXF) system, in accordance with an embodiment of the present invention.

In Total-Reflection X-ray Fluorescence (TRXF) measurements, a beam of X-rays illuminates a surface of a sample comprising a substrate, such as a surface of a silicon or compound semiconductor wafer, at a grazing angle in the vicinity of the critical angle of total external reflection (TER), which is a fraction of a degree for most X-ray wavelengths used and substrate materials. An X-ray fluorescence (XRF) detector measures intensities of the resulting X-ray fluorescence radiation, which is emitted by different contaminating atoms in response to being excited by the incident X-ray beam. A processor analyzes the measured X-ray fluorescence and indicates constituents, distribution, and levels of contaminants.

Embodiments of the present invention that are described hereinafter provide apparatus and methods that yield enhanced TRXF detection.

At the critical angle, an X-ray positive interference effect increases the X-ray fluorescence signal, as described below. Thus, in order to maximize the sensitivity and accuracy of TRXF contamination measurements, the sample should be kept angularly aligned closely to the critical angle of TER. Example alignment techniques are described herein.

Additionally, a shielding of the XRF detector against stray background X-rays is typically helpful, for example, in order to suppress background X-ray fluorescent or scattered radiation that may otherwise reduce the signal to noise ratio. Example high-performance shields are described herein.

In some embodiments of the present invention that are described hereinafter, enhanced TRXF detection capabilities of surface contamination is achieved by using (a) fast and accurate control of the X-ray grazing angle of incidence near the critical angle of TER, using optical gauging followed by X-ray fluorescence gauging, and/or (b) multi-layer shielding of the XRF detector with superior suppression of background X-ray fluorescence noises.

The disclosed techniques are applicable to various applications, such as characterizing semiconductor wafers, and thus, the terms "wafer", "sample" and "substrate" are used interchangeably in the present patent application.

As indicated above, the disclosed techniques maintain the incident angle in the vicinity of the critical angle. At the critical angle, the constructive interference between the reflected and transmitted wave-fields associated with the X-rays is maximal, which results in an approximate two-fold increase in the electric field at the surface of the substrate. The increase in the electric field causes a near four-fold increase in the X-ray fluorescence signal from the surface as compared, for example, to measurement at angles above double the critical angle. The enhancement of the X-ray fluorescence intensity from surface elements near the critical angle, and the limited penetration of the X-ray beam into the sample, results in sensitive and accurate TRXF measurements of contamination, further improved due to a low substrate background signal that would otherwise mask part of the signal. In most cases the target incident angle is set to some fraction, for example, half the critical angle so as to maximize the signal-to-background ratio or based on whether particulate, film-lime or a mixture of contaminants are of interest.

In some embodiments, a disclosed TRXF system applies an optical inclinometer to accurately control the angle of incidence in the vicinity of the critical angle. The inclinometer receives optical radiation reflected from the surface of the wafer and outputs signals indicative of the parallelism of the wafer relative to the inclinometer. By measuring parallelism, the optical inclinometer measures an inclination of the surface of the sample. The system can be calibrated such that, when the wafer is aligned parallel to the inclinometer along the X-ray beam direction, the angle between the wafer and the incident X-ray beam equals a specified target angle that is some fraction of the critical angle. (The term "optical radiation," as used in the present description and in the claims, refers to visible, infrared, or ultraviolet radiation, as opposed to the X-ray radiation that is used in X-ray fluorescence measurements.)

Control circuitry drives a motor in response to the signal output of the inclinometer in order to set and maintain the desired accuracy and precision of the incidence angle. The inclinometer repeatability and linearity are better than one milli-degree (0.001°) on a blank substrate, which is significantly better than with techniques known in the art.

Furthermore, even if angular alignment achieved by methods known in the art is sufficiently accurate, these methods suffer from lengthy alignment times, up to a minute or more per site in some situations. This is undesirable as it can significantly reduce the throughput of a TRXF system.

In some embodiments, subsequent to the optical alignment, and sometimes during a measurement session, the system fine-tunes the optically determined grazing angle so as to stabilize the X-ray fluorescence signals, for example, from contaminants. To further fine-tune the grazing angle, the XRF detector measures the X-ray fluorescence intensity of a given spectral line, such as an emission line of the substrate (e.g., the intensity of the SiKα emission line of a silicon wafer, which is indicative of the incidence angle, as described below). Based on the measured substrate X-ray fluorescence intensity, the processor directs slight adjustments of the grazing angle about the optically determined local angle of the surface of the substrate.

In some embodiments, in order to fine-tune the grazing angle, the angle of incidence is offset to some higher angle by a small amount to increase the substrate X-ray fluorescence intensity. An increase of intensity, for example, of the SiKα emission line from a silicon wafer, is utilized to either reduce the duration of the fine-tuning for a given precision, or to improve the precision of the angular fine-tuning achieved at a given duration. Based on the increased SiKα signal, the processor determines the value of the higher grazing angle, for example, based on a stored calibration lookup table comprising SiKα fluorescence intensity as a function of angle of incidence. Finally, again using the calibration lookup table, the processor directs a decrease in the grazing angle to a locally fine-tuned critical angle.

In some embodiments, multi-layer shielding elements for X-ray detectors are provided, wherein the multi-layer shields comprise multiple layers. The shielding elements may be shaped in a form of a cylinder or in a form of a plate, among other possibilities. As a stray X-ray incident in a direction from front to back, e.g., with a shield plate, the multiple layers of the shield progressively attenuate the X-ray fluorescence of progressively-decreasing energies (progressively-increasing wavelengths) emitted from previous layers of the shield.

In an embodiment, a front layer made of light-metal (e.g., aluminum) first attenuates stray X-rays, for example from an incident X-ray beam of 22 keV (AgKa) and encapsulates the other metals in the sandwich. Off the wide energy beam, the light-metal mainly attenuates a portion of X-rays of lower energies. As the front layer attenuates (and spectrally filtrates) the X-incident X-rays, excited atoms of the front layer emit X-ray fluorescence. Subsequently, a heavy-metal, such as tantalum, strongly attenuates the highest X-ray fluorescence energies thus emitted. The incident X-ray beam further causes a fluorescent emission of X-rays from the tantalum itself, with a lower energy than the incident radiation. A layer of a medium-weight metal, such as silver, is then used to attenuate the X-rays emitted from the tantalum layer and, finally, a light-weight metal layer, such as aluminum, is used to attenuate the X-rays emitted from the medium-weight metal layer (e.g., silver).

Using the techniques described herein (i.e., rapidly achieving X-ray fluorescence signal with an incident X-ray beam in the vicinity or below the critical angle, with superior suppression of background X-ray fluorescence and scattering (noises) the disclosed TRXF system achieves high throughput and improved lower limits of detection (LLDs). For example, the disclosed system is able to detect, within ten seconds per measurement site, minute quantities of material, e.g., of around $10^{10}$ atoms/cm² for transition metals such as Cu. Furthermore, due to the low background, the disclosed system can detect contamination within about 1000 s even more minute quantities of materials, such as transition metals, with concentration of around $10^9$ atoms/cm².

System Description

FIG. 1 is a schematic side view of a Total-Reflection X-ray Fluorescence (TRXF) system 20 for X-ray fluorescence measurement of a sample 22, in accordance with an embodiment of the present invention. Alternatively, system 20 may be configured, with the necessary changes having been made, for other types of X-ray measurements, including X-ray reflectometry (XRR), and in particular grazing-incidence X-ray fluorescence (GIXRF), small-angle X-ray scattering (SAXS), grazing incidence SAXS, and X-ray diffraction (XRD) measurements.

Sample 22, such as a semiconductor wafer, is mounted on a motion stage 24. Motion stage 24 is translated and/or rotated by motors 40, which are controlled by a control unit 42 as directed by a processor 34. Motion stage 24 allows accurate adjustment of the position of sample 22 along three orthogonal directions (x, y and z), and adjustment of sample 22 orientation in two angles: angle of incidence w about the y-axis, such as of a grazing angle 10 near critical angle of TER, and azimuth angle φ about the z-axis. In some systems a third angular adjustment, tilt angle χ, is provided about the x-axis. To reduce possible vibrations, stage 24 may be mounted, for example, on a massive base, made of a material such as granite, with pads for vibration damping (not shown), as are known in the art. In an embodiment, motors 40 comprise a servo or stepper motor, which is able to move stage 24 with a resolution finer than 1 μm. Alternatively, other types of precision motors, as are known in the art, may be used for aligning wafer 22.

An X-ray source (not shown), such as an X-ray tube with suitable monochromatizing optics (not shown), generates and directs an X-ray beam 27 to be incident at the grazing angle on an area 28 on the surface of sample 22. Beam 27 may be collimated or focused onto area 28. The mean X-ray energy of beam 27 may vary from several keV to several tens of keV, as described below.

A diverging beam 29 of X-ray fluorescence from area 28 of sample 22 is collected by an XRF detector 32a. XRF detector 32a measures the energy spectrum of excited X-ray fluorescence (i.e., of X-ray photons emitted from sample 22 in a near-normal direction to the surface of the sample over a range of energies). In an embodiment, XRF detector 32a comprises a Silicon Drift Detector (SDD), although other detector types may alternatively be used.

In some embodiments, based on a feedback signal generated by optical rangefinder 44a, control unit 42 commands motion stage 24 to vertically adjust the surface of sample 22 relative to detector 32a. The indication provided by rangefinder 44a is based on optical radiation reflected from the surface of sample 22, which is indicative of the distance between sample 22 and rangefinder 44a.

Another XRF detector, detector 32b, is used for measurements of an energy spectrum of the X-ray fluorescence caused by another X-ray source (not seen). In an embodiment, XRF detector 32b is used for measuring X-ray fluorescence excited by a high-energy X-ray source (e.g., of 22 keV (AgKα)), whereas XRF detector 32a is used for measuring X-ray fluorescence excited by an X-ray source of lower energy (e.g., such as 9.67 keV (WLβ1), 5.41 keV (Cr Kα), or the W M-lines). Detectors 32a and 32b are typically displaced, one to the other, along x and y directions, where the y direction is shown in FIG. 1 as pointing out of the page, so as not to be within each other's X-ray beam shadow.

XRF detectors 32a and 32b are connected to pulse-processing electronics (not shown) that in turn are connected to a processor 34. The electrical signals are converted to a spectrum (photons at a given energy) by the pulse processor, and the spectrum is analyzed in software by processor 34 so as to assess a property of sample 22. Processor 34 then outputs the results of the analysis to a display 36.

The energy of the peaks corresponding to the characteristic X-ray emissions from excited elements in the sample are identified by a software, and then the net intensity (intensity above background) is determined, either by direct methods such as summing the counts in a range of channels in a region-of-interest around elemental peak positions, or by fitting the spectrum to a model that describes the background, the elemental peaks, and any additional artifacts that are to be accounted for. The difference between the measured and calculated spectra is minimized by a non-linear regression algorithm that automatically adjusts the model parameters. Typical parameters are the net intensities of elemental peaks, coefficients for the background model, and the parameters that characterize the detection system response (e.g. energy offset, gain, and resolution). The net intensities are then converted to concentrations by multiplying the intensity by a sensitivity factor that has been measured for one or more reference elements, for example Ni, and then calculated for other elements of interest.

As noted above, precise control of the grazing angle is critically important in order to obtain sensitive and accurate measurements of the composition of the surface of sample 22. In some embodiments, an optical inclinometer is used for outputting an optical feedback signal indicative of the parallelism (i.e., inclination) of the surface of sample 22 at grazing angle 10 relative to the inclinometer. In an embodiment, the inclinometer comprises a single optical gauge capable of precisely measuring an angle about a single rotation axis within the x-y plane so as to measure a tilt angle about the y-axis.

In an embodiment, a 2D optical inclinometer 49 outputs an optical feedback signal indicative of the parallelism (i.e., inclination) of the surface of sample 22 relative to inclinometer 49. In an embodiment, when the surface of wafer 22 is parallel to inclinometer 49, the angle between the surface of sample 22 and beam 27 is some specified (target) grazing angle 10, which is a fraction of the critical angle. Based on the optical feedback from inclinometer 49, control circuit 42 rotates motion stage 24 about the y-axis, so as to maintain the grazing angle at the critical angle, and within a given tolerance.

In an embodiment, 2D inclinometer 49 comprises two optical gauges, each capable of precisely measuring an angle about a single rotation axis of two axes that are mutually orthogonal within the x-y plane so as to measure two tilt angles about both x- and y-axes. The optical gauges typically consist of a laser or LED light source and a position-sensitive detector (PSD) that is adapted to determine a distance or angle relative to the surface of the sample. Details of such optical rangefinders and methods of usage are provided in the above described U.S. patent application Ser. No. 15/717,961 titled, "Closed-Loop Control of X-ray Knife Edge," filed Sep. 28, 2017, whose disclosure is incorporated herein by reference.

Control unit 42 receives indications from the rangefinders and correspondingly tilts sample 22 to target grazing angle 10 relative to beam 27. Optionally, 2D inclinometer 49 is configured to indicate an additional tilt angle χ, that would keep wafer 22 oriented about the x-axis as required, relative to beam 27, so as to optimally excite the X-ray fluorescence.

Alternatively, other types of optical orientation measurement devices, including both commercially available and purpose-built instruments, can be used as an inclinometer and are considered to be within the scope of the present invention.

In some embodiments, motion stage 24 is directed by processor 34 to fine-tune grazing angle 10 after being excited by a measured intensity of an X-ray fluorescence peak from the substrate material of sample 22 (e.g., using the measured intensity of the SiKα peak, in the case of a silicon wafer), as further described below.

In an embodiment, system 20 comprises an additional X-ray detector 35, which is configured to measure specular X-rays reflected from the sample at grazing angles (e.g., an XRR detector). In some embodiments, processor 34 is further configured to indicate constituents, distribution (both parallel and perpendicular to the substrate surface), and levels of contaminants, based on the measured X-ray fluorescence and the measured X-ray specular reflection.

In some embodiments, the edge of detector 32a (i.e., the detector 32a snout) is shielded against stray X-rays with multilayer detector shield 38a. Shield 38 has a hollow cylinder shape and comprises multiple layers. The multiple layers are configured to progressively attenuate X-ray fluorescence and scattered X-ray radiation which is emitted toward X-ray detector 38a from a previous (i.e., adjacent outer) layer of the multi-layer shield, which may interfere with the X-ray fluorescence radiation emitted by sample 22, as described below.

The lower edge of multilayer collimator 38a is typically positioned 1-2 mm above the surface of the wafer so as to minimize unwanted fluorescence and scattering. Stage 24 is directed by processor 34 to vertically adjust the distance between the lower edge of collimator 38a, so as to reduce the distance to the wafer surface to less than 1 mm and thus also reduce the footprint of the incident X-ray beam. In an optional embodiment, the distance is optically monitored and indicated to processor 34 by optical rangefinder 44a.

The spatial resolution and precision of X-ray measurements can be improved by reducing the size of an elongated footprint of a grazing X-ray beam on the sample surface. In some embodiments, a beam-limiting element, such as a plate 38b, is used to reduce the footprint of an X-ray beam that incidents sample 22. In some embodiments, plate 38b is configured to serve as a multilayer detector shield, as described below.

In some embodiments, control unit 42 drives motors 40 based on a feedback signal, indicative of the distance of the surface of sample 22 from plate 38b, that an optical rangefinder 44b outputs based on optical radiation reflected from the surface of sample. Alternatively or additionally, a feedback signal indicative of a height of plate 38b over sample 22 (i.e., z-position) may arise from an X-ray beam that is specularly reflected by the surface of the sample. In an embodiment, the height of plate 38b over sample 22 (i.e., a gap) is determined such that plate 38b cuts half of the intensity of an incident X-ray beam, as measured by detector 35.

Thus, plate 38 acts as a knife-edge which defines the parallel gap between the surface of sample 22, and which blocks the portion of an X-ray beam that does not pass through the gap. In some embodiments, based on an optical feedback from 2D inclinometer 49, processor 34 maintains plate 38b aligned parallel to the surface of sample 22, in any location over the surface adjacent to the area on which the X-ray beam incidents. The geometry (width, height, and shape) of plate 38b is optimized so as to avoid touching the sample surface at small gap heights.

The configuration of system 20 and its components, as shown in FIG. 1, are example configurations that are shown purely for the sake of conceptual clarity. Any other suitable system configurations can be used in alternative embodiments. The different elements of system 20 may be implemented using suitable software, using hardware, or using a combination of hardware and software elements. In some embodiments, processor 34 comprises a general-purpose programmable processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Improved X-Ray Fluorescence Apparatus for Contamination Monitoring

Figure 2A:
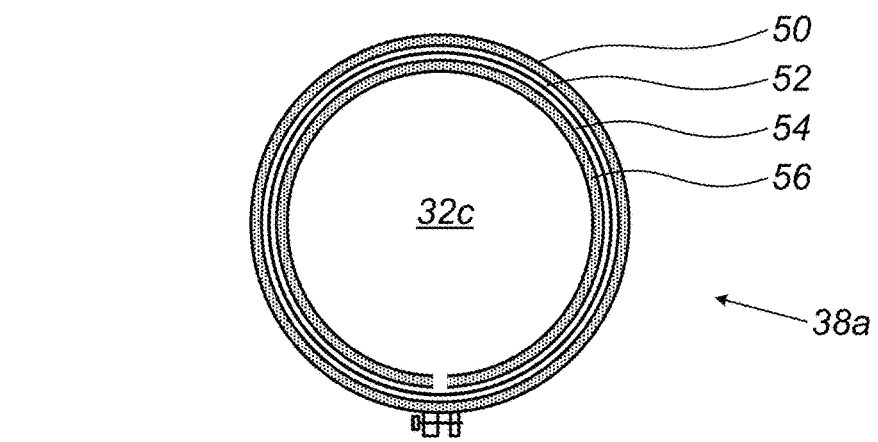
FIGS. 2A and 2B are schematic cross-sectional bottom-views of X-ray detector shields comprising multiple layers, in accordance with embodiments of the present invention.
Figure 2B:
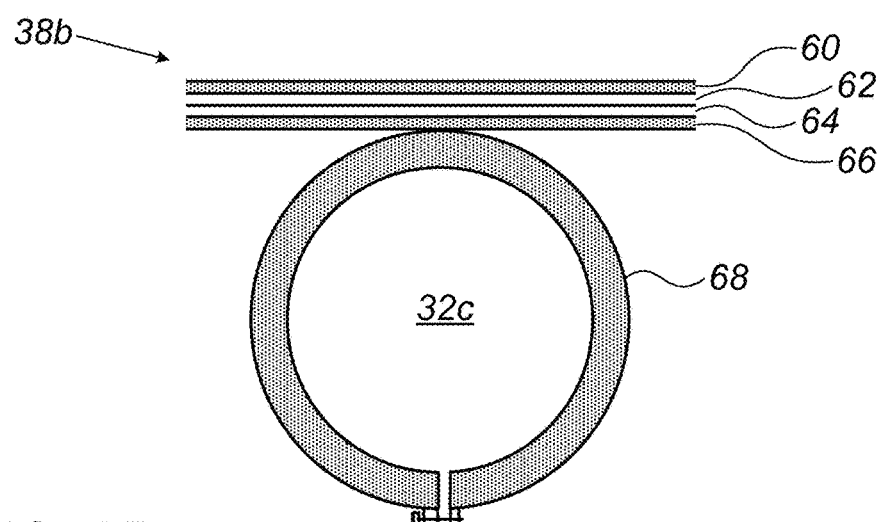

FIGS. 2A and 2B are schematic cross-sectional bottom-views of X-ray detector shields comprising multiple layers, in accordance with embodiments of the present invention. In general, the shield is fitted at the end-section of the X-ray detector (e.g. at a detector snout), to suppress stray X-rays before such X-rays incident the detector.

As seen in FIG. 2A, an active area 32c of an XRF detector (such as of detector 32a) is collimated by a multi-layer cylindrical shield collimator 38a. An incident X-ray beam initially interacts with an outer layer 50 of shield 38a. Layer 50 is made of light-weight metal, such as aluminum or titanium, which preferentially attenuates a low-energy portion of the beam. For some embodiments, a light-weight metal is defined as a metal belonging to periods 3 or 4 of the periodic table. The "energy-hardened" beam (i.e., having a higher average energy as a result of a preferential filtration of low-energy X-rays by layer 50) is subsequently attenuated by a heavy-metal layer 52, such as tantalum or tungsten. For some embodiments, a heavy-weight metal is defined as a metal belonging to periods 6 and higher of the periodic table. As a side effect, layer 52 itself becomes a source of fluorescent emission of X-rays having a lower energy than that of the filtered incident radiation. A following layer 54, made of medium-weight metal such as silver or molybdenum, attenuates X-rays emitted from layer 52 (e.g. from the tantalum layer). For some embodiments, a medium-weight metal is defined as a metal belonging to period 5 of the periodic table. Finally, an inner layer 56 of a light-weight metal, such as aluminum again, attenuates the X-rays emitted from the silver layer. The disclosed method of progressive attenuation of the stray X-rays results in lower background X-ray fluorescence noise, as demonstrated below.

In another embodiment, seen in FIG. 2B, a combined multi-layer detector shield and knife edge plate 38b is provided, while the detector itself is contained in a cylindrical collimator 68. Shield 38b uses successive layers comprising a front aluminum layer 60, i.e., a light-weight metal, by which an incident X-ray beam initially is attenuated. The slightly hardened beam is subsequently attenuated by a tantalum heavy-metal layer 62, which itself causes fluorescent emission of X-rays with a lower energy than the incident radiation from layer 60. A following silver medium-weight metal layer 64 is subsequently used to attenuate the X-rays emitted from tantalum layer 62. Finally, a back light-weight metal layer 66, e.g., of aluminum, is used for attenuating the X-rays emitted from the silver layer. Collimator 68 is also made of a light-weight metal, such as aluminum, so as to preferentially attenuate remaining low-energy X-rays.

The thickness of each of the disclosed multiple layers is typically a few hundred microns. The metals are of high purity (e.g., purity>99.9%) so as not to introduce additional fluorescence peaks. Materials other than those described in this example can be used in a similar manner to progressively attenuate X rays of decreasing energies, such as the light-weight titanium, the heavy-weight lead, and the medium-weight tin, among others.

The illustrations shown in FIGS. 2A and 2B were chosen purely for the sake of conceptual clarity. FIG. 2 shows only parts relevant to embodiments of the present invention. Other shield geometries which attenuate background fluorescence specific to system 20 implementation are possible, as would occur to a person skilled in the art.

Figure 3:
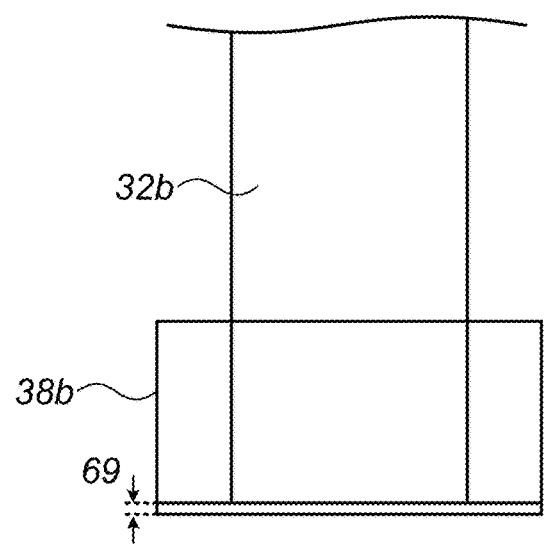
FIG. 3 is a schematic front view of the combined multi-layer detector shield and knife edge collimator of FIG. 2B, in accordance with an embodiment of the present invention.

FIG. 3 is a schematic front view of a combined multi-layer detector shield and knife edge collimator 38b of FIG. 2B, in accordance with an embodiment of the present invention. As seen, the multi-layer detector shield and knife edge 38 protrudes slightly (e.g., about a length 69 of 500 µm) below the lowest point of the XRF detector 32b snout, to prevent an incident X-ray beam from directly irradiating the detector.

Furthermore, by protruding, plate 38b both determines a gap above the surface of the sample through which X-ray incidents the surface, and also blocks the rest of the beam, thus acting, and being controlled to regulate, the size of the gap as well as serving as a knife-edge, as, for example, described above in U.S. patent application Ser. No. 15/717,961.

The combined multi-layer detector shield and knife edge collimator shown in FIG. 3 is chosen purely for the sake of conceptual clarity. The width, height, and shape of plate 38b can vary to optimize its capabilities to attenuate background fluorescence, as would occur to a person skilled in the art.

Figure 4:
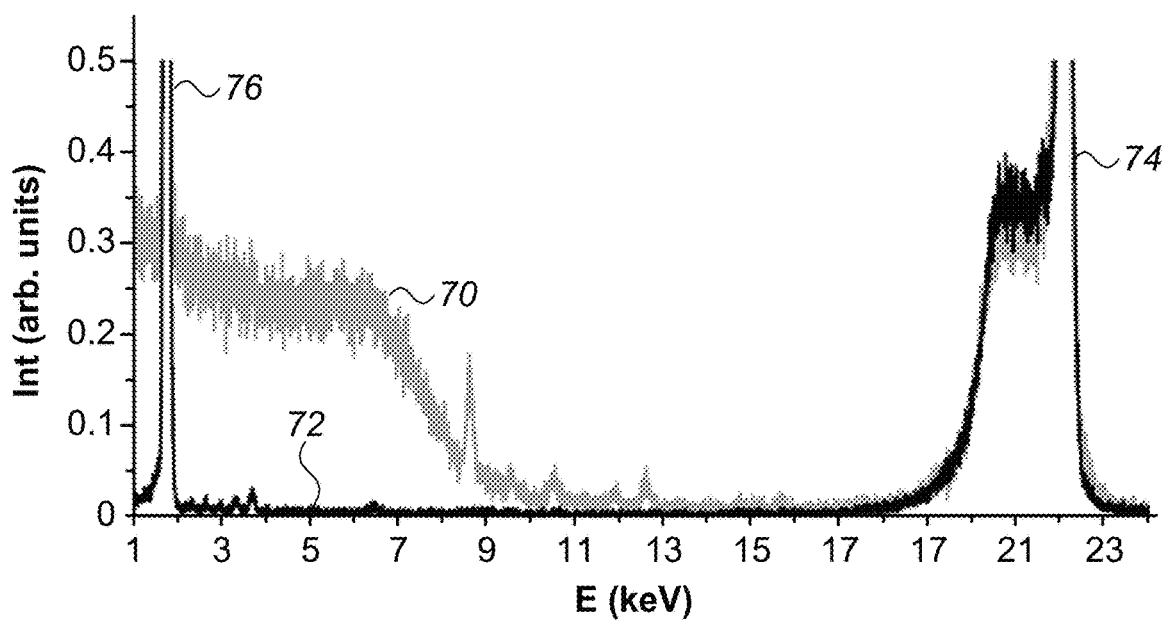
FIG. 4 shows two graphs of measured X-ray background fluorescence, in accordance with an embodiment of the present invention.

FIG. 4 shows two graphs of measured X-ray background fluorescence, in accordance with an embodiment of the present invention. The shown curves, emitted from a surface of a silicon wafer, demonstrate a reduction in X-ray fluorescence background signals with the combined multi-layer detector shield and knife edge collimator 38b shown in FIG. 2B, as compared with a simple lead shield comprising a slab of Pb plate about 0.5-1 mm thick placed 1-2 mm above the surface of the sample.

Specifically, a first X-ray florescence spectrum 70 is measured with the detector fitted with the simple lead (Pb) shield. A second X-ray florescence spectrum 72 is measured with the detector shielded with the multi-layer shield shown in FIG. 2B.

The strong X-ray peak 74 at about 22 keV (AgKα) is a stray signal of an incident X-ray beam. The strong X-ray fluorescence peak 76 at about 1.8 keV is the excited wafer's SiKα fluorescence line.

As seen, with shield 38b, background fluorescence noise at all energies under 20 keV is greatly reduced. Specifically, stray peaks seen at spectrum 70 at about 12.5 keV, 12 keV, 10.5 keV, 9.5 keV, and 8.8 keV, are eliminated in spectrum 72. In addition, a continuous background X-ray fluorescence between 1 keV and about 10 keV that spectrum 70 is practically eliminated as well in spectrum 72.

The spectra shown in FIG. 4 are chosen purely for the sake of conceptual clarity. Spectrum 72 can show different suppressed fluorescence noise curves, which correspond to different multilayer shielding designs. For example, a spectrum may demonstrate minimal noise at a specific energy, implemented by a multilayer shield design, so as to detect a specific contaminant that emits at the specific energy.

Figure 5:
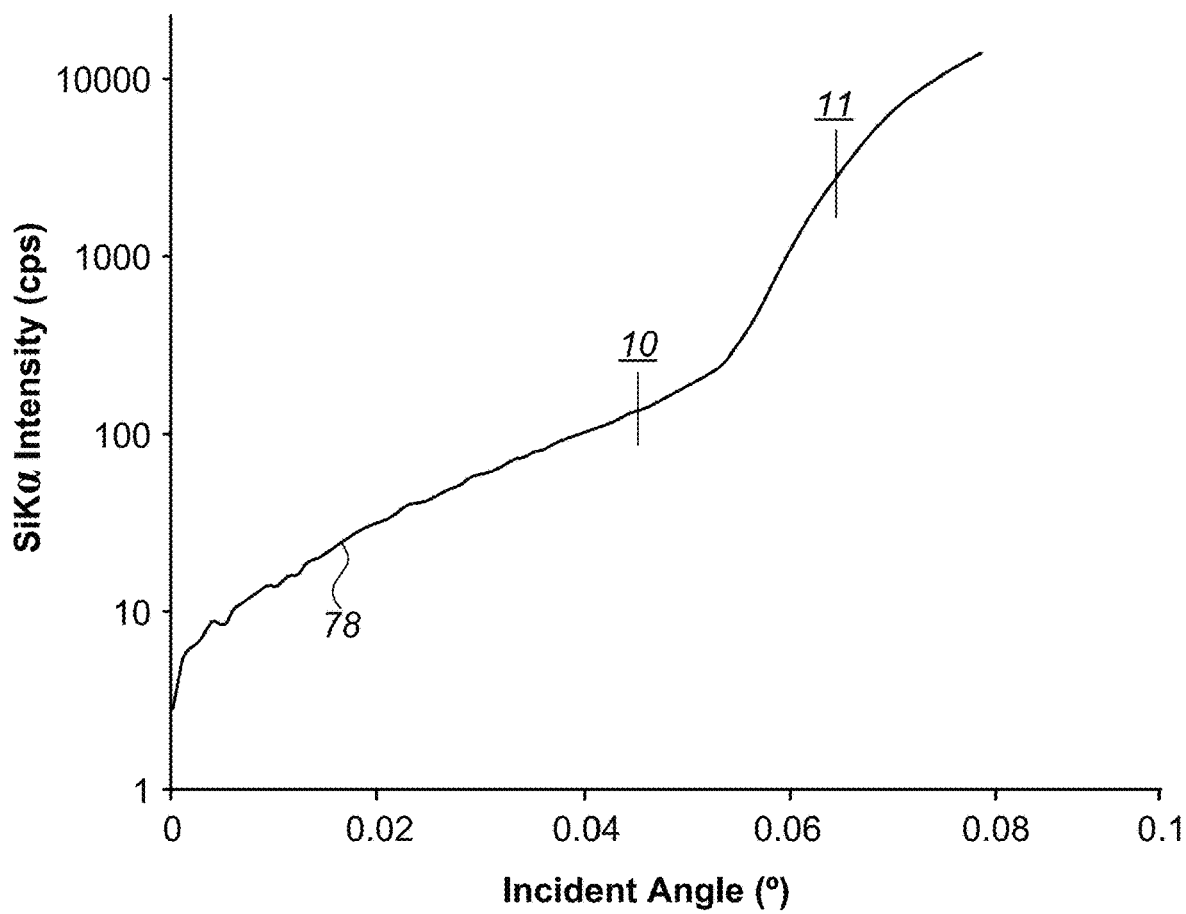
FIG. 5 is a calibration curve consisting of a SiKα X-ray fluorescence intensity as a function of grazing incident angle, in accordance with an embodiment of the present invention.

FIG. 5 is a calibration curve 78 consisting of a SiKα X-ray fluorescence intensity as a function of grazing incident angle, in accordance with an embodiment the present invention. As noted above, the signal is emitted from the surface of a silicon wafer at an X-ray fluorescence energy of about 1.8 keV. As seen in FIG. 5, calibration curve 76 is a continuous line, which is calculated based on X-ray fluorescence data, for example by processor 34 interpolating or fitting an analytical function to the data. For other combinations of substrate type and incident X-ray radiation, other calibration curves are measured and used. For example, for any substrate material composition, an intensity of a fluorescent line from a major element within the substrate can be used. For example, for the case of GaAs substrates then then Ga Kα fluorescent intensity as a function of incident angle could be used. As other examples, Si Kα line is used in the case of Si:C, and one of In (indium) fluorescence lines is used in the case of an InP substrate.

In an embodiment, processor 34 is configured to store, in memory, a calibration lookup table from which curve 78 is obtained, for future use, for example in order to fine-tune grazing angle 10 during a TRXF measurement. In an embodiment, processor 34 is configured to find the value specified target angle 10 at a given measurement site by first increasing the grazing angle (e.g., according to the optically indicated target grazing angle 10, by inclinometer 49), so as to increase the measured intensity of the SiKα fluorescence line at an angle 11. Then, processor 34 determines the increased grazing angle from a stored calibration lookup table of a SiKα fluorescence line intensity as a function of angle of incidence. Finally, based on calibration curve 78, processor 34 directs control unit 42 to decrease the grazing angle (e.g., by adjusting the orientation of sample 22) to the locally fine-tuned grazing angle 10.

The calibration curve shown in FIG. 5 is brought by way of example. Other X-ray fluorescence energy lines may be used for the calibration. The method of calibration of target grazing angle 10 using the yielded X-ray fluorescence intensity may vary, as would occur to a person skilled in the art.

Figure 6:
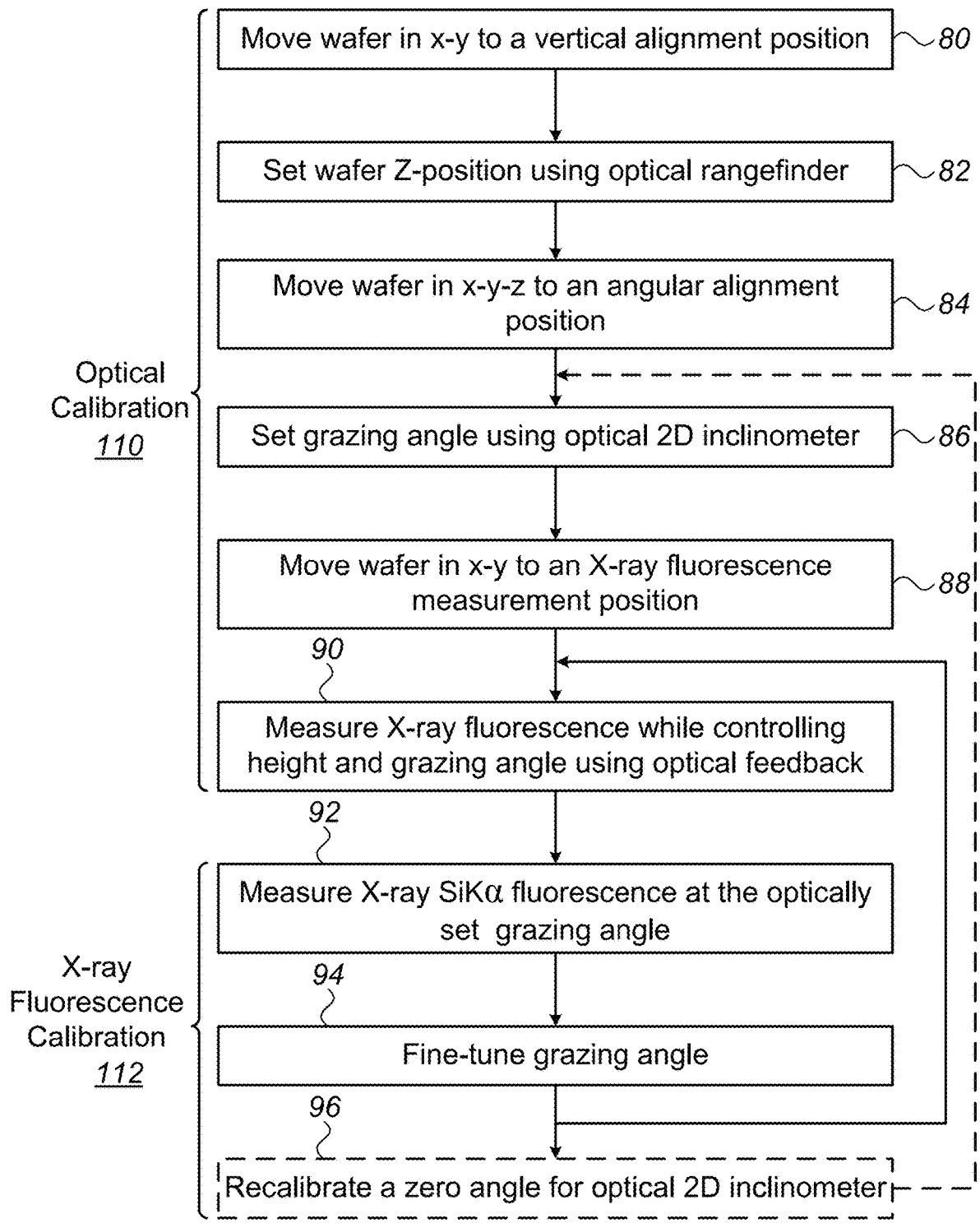
FIG. 6 is a flow chart that schematically illustrates a method for X-ray fluorescence measurement, in accordance with an embodiment of the present invention.

FIG. 6 is a flow chart that schematically illustrates a method for X-ray fluorescence measurement, in accordance with an embodiment of the present invention. In some embodiments, the control of both height and angle, as well as the contamination measurements, are performed at least partially together. As FIG. 6 shows, an optical calibration phase 110 is followed by X-ray fluorescence-based calibration phase 112 for fine-tuning the optically determined grazing angle.

Calibration phase 110 begins with control unit 42 directing stage 24 to move (wafer 22) in x-y directions to a vertical alignment position that is under the optical rangefinder 44a, at a first lateral translation step 80.

Next, based on a distance measurement performed by optical rangefinder 44a, processor 34 calculates the height of rangefinder 44a over the surface of wafer 22. Based on the calculated height, processor 34 determines, at a vertical alignment step 82, an offset $\Delta z$ between a measured z-position and a target vertical position of wafer 22 relative to plate 38b, that cuts half of the intensity of incident X-ray beam 27, as measured by detector 35. (Detector 35 is located in the path of the specularly reflected beam 27.)

Next, at a second translation step 84, control unit 42 vertically moves wafer 22 by $-\Delta z$, to the target position determined in step 2, and further horizontally moves wafer 22 to a second alignment position so that the measurement position is under optical 2D inclinometer 49.

Next, optical 2D inclinometer 49 measures, and indicates to processor 34, the parallelism (i.e., inclination) of the surface of wafer 22 relative to the surface of 2D inclinometer 49. Based on the measured parallelism (i.e., based on the measured local inclination of the surface of wafer 22), processor 34 determines the grazing angle, w, between the surface of wafer 22 and the incident X-ray beam 27. Subsequently, processor 34 calculates a required angle offset $\Delta \omega_1$ used by processor 34 to direct control unit 42 for rotation of stage 24 about the y-axis, so as to align wafer 22 at critical angle 10, at an angular alignment step 86.

Optionally, processor 34 determines a tilt angular offset $\Delta \chi$ (i.e., along the x-axis) between the wafer and the beam, for instructing a required respective rotation about the x-axis.

At a third translation step 88, control unit 42 moves wafer 22 in x-y-z directions to a preset target location over wafer 22 for measurement.

Finally, in phase 110, at an X-ray fluorescence measurement step 90, based on optical feedback, control unit 42 directs stage 24 to translate and/or rotate the sample so that the incident X-ray beam intercepts the surface of the sample at the optically calibrated target angle 10 and target height. Next, system 21 measures X-ray fluorescence from wafer 22, for example, to determine its surface contaminant constituents, distribution, and levels.

Steps 80-90 of phase 110 are usually done during tool setup, and offsets are determined and stored in a memory of processor 34 for later use in the subsequent steps described below. However, steps 80-92 may also be performed more frequently, if needed, e.g., once per wafer lot or once per wafer, or after a set interval of time, so as to maintain the calibration of system 20.

In some embodiments, an X-ray fluorescence-based calibration phase 112 is added, to fine-tune the optically determined grazing angle. Calibration steps 92-96 of phase 112 are performed at one or more sites on wafer 22.

At a substrate X-ray fluorescence measurement step 92, system 20 measures a first X-ray fluorescence intensity value of an emission line of wafer 22, such as the SiKα fluorescence line. The system performs the fluorescence measurement at the optically determined target grazing angle 10, found in step 86, being nominally corrected in the process, for example, for local non-planarity of wafer 22.

At an angle fine-tuning step 94, control unit 42 adjusts the tilt of wafer 22 so as to increase (or decrease) the incident grazing angle, depending if the SiKα fluorescence intensity is lower (or higher) than a specified value (e.g., based on calibration curve 78 of FIG. 5), respectively. If the resulting intensity of the SiKα fluorescence line is within some specified tolerance, processor 34 ends the alignment process described by steps 92-94.

In an optional embodiment, at an 2D inclinometer calibration step 96, processor 34 recalibrates a zero-angle reference for optical 2D inclinometer 49, based on the fine X-ray adjustment, and stores this in memory for later use at subsequent sites on the current wafer or to update the system calibration for subsequent wafers.

The process flow shown in FIG. 6 is brought by way of example. Other steps may be included, for example, such that use X-ray reflection signals measured by X-ray detector 35 for fine-tuning the grazing angle to achieve target grazing angle 10. In some embodiments, the specified incidence angle may be offset to some higher angle by a small amount $\Delta\omega_2$, in order to increase the substrate fluorescence intensity measured in step 92, as described in FIG. 5. Next, based both on the increased substrate fluorescence intensity and on calibration curve 78, processor 34 determines an amount of angular offset $\Delta\omega_3$ from the target fine-tuned grazing angle 10 and correspondingly instructs control unit 42 to drive motors 40 to tilt stage 24 over y-axis by the amount $-\Delta\omega_3$.

The flow chart of FIG. 6 is brought by way of example. For clarity, only part of the possible calibration steps is shown.

Although the embodiments described herein mainly address the X-ray measurement of contamination over silicon wafers, the methods and systems described herein can also be used in other applications, such as in measuring contamination on other substrate materials, including but not limited to III-V materials such as GaAs as well as others such as Si:C. In addition to single crystal semiconductor substrates, the technique can be used for monitoring the contamination of other substrate materials such as glass or polymers, provided that their surfaces are sufficiently flat and smooth.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus for X-ray measurement, comprising:
   an X-ray source, which is configured to generate and direct an X-ray beam to be incident at a grazing angle on a surface of a sample;
   an X-ray detector, which is configured to measure X-ray fluorescence emitted from the surface of the sample in response to being excited by the X-ray beam;
   an optical inclinometer, which is configured to measure an inclination of the surface of the sample; and
   a processor, which is configured to calibrate the grazing angle of the X-ray beam based on the measured inclination, and to further fine-tune the grazing angle based on the X-ray fluorescence measured by the X-ray detector.

2. The apparatus according to claim 1, wherein the processor is further configured to detect contaminants on the sample based on the measured X-ray fluorescence.

3. The apparatus according to claim 1, wherein the processor is further configured to store in a memory a resulting calibration lookup table for the grazing angle.

4. The apparatus according to claim 1, wherein the processor is configured to fine-tune the grazing angle based on a measured X-ray fluorescence intensity of a given spectral line.

5. The apparatus according to claim 4, wherein the given spectral line is a fluorescence line of a chemical element that the sample comprises.

6. The apparatus according to claim 4, wherein the sample comprises a silicon substrate, and wherein the given spectral line is a SiKα line.

7. The apparatus according to claim 4, wherein the processor is configured to determine the grazing angle from a stored calibration lookup table comprising fluorescence intensity of the given spectral line as a function of angle of incidence.

8. The apparatus according to claim 1, wherein the X-ray source comprises multiple X-ray sources configured to excite X-ray fluorescence at multiple different X-ray energy bands, and wherein the X-ray detector comprises multiple X-ray detectors configured to detect the X-ray fluorescence at respective multiple different X-ray energy bands.

9. The apparatus according to claim 1, and comprising an additional X-ray detector, which is configured to measure X-rays that are specularly reflected by the sample at the grazing angle.

10. The apparatus according to claim 1, wherein the processor is further configured to recalibrate a zero-angle reference for the optical inclinometer based on the fine-tuning, and to store the calibrated zero-angle reference for later use at subsequent measurement sites on the sample or for use with subsequent samples.

11. The apparatus according to claim 1, and comprising a multi-layer shield, which comprises multiple layers, each layer configured to attenuate stray X-ray fluorescence radiation of progressively-increasing wavelength emitted toward the X-ray detector from a previous layer of the multi-layer shield.

12. An apparatus for X-ray measurement, comprising:
an X-ray source, which is configured to generate and direct an X-ray beam to a surface of a sample;
an X-ray detector, configured to detect X-ray fluorescence radiation emitted from the sample in response to being excited by the X-ray beam; and
a multi-layer shield, which comprises multiple layers, each layer configured to attenuate stray X-ray fluorescence radiation of progressively-increasing wavelength emitted toward the X-ray detector from a previous layer of the multi-layer shield.

13. The apparatus according to claim 12, wherein a first layer of the multiple layers traversed by the X-ray beam is made of a light-weight metal, a second layer traversed by the X-ray beam is made of a heavy-weight metal, a third layer traversed by the X-ray beam is made of a medium-weight metal, and a fourth layer traversed by the X-ray beam is made of a light-weight metal.

14. The apparatus according to claim 12, wherein the multi-layer shield comprises a plate mounted in front of a snout of the X-ray detector.

15. The apparatus according to claim 12, wherein the multi-layer shield protrudes below a lowest point of a snout of the X-ray detector.

16. The apparatus according to claim 12, and comprising:
an optical inclinometer, which is configured to measure an inclination of the surface of the sample; and
a processor, which is configured to calibrate the grazing angle of the X-ray beam based on the measured inclination, and to further fine-tune the grazing angle based on the X-ray fluorescence measured by the X-ray detector.

17. A method for X-ray measurement, the method comprising:
generating and directing an X-ray beam to be incident at a grazing angle on a surface of a sample;
measuring X-ray fluorescence emitted from the surface of the sample in response to being excited by the X-ray beam;
measuring an inclination of the surface of the sample; and
based on the measured inclination, calibrating the grazing angle, and, based on the measured X-ray fluorescence, further fine-tuning the grazing angle.

18. The method according to claim 17, and comprising detecting contaminants on the sample based on the measured X-ray fluorescence.

19. The method according to claim 17, and comprising storing in a memory a resulting calibration lookup table for the grazing angle.

20. The method according to claim 17, wherein fine-tuning the grazing angle comprises fine-tuning the grazing angle based on a measured intensity of a given spectral line.

21. The method according to claim 20, wherein fine-tuning the grazing angle comprises fine-tuning the grazing angle based on a measured intensity of a fluorescence line of a chemical element that the sample comprises.

22. The method according to claim 20, wherein the sample comprises a silicon substrate, and wherein fine-tuning the grazing angle comprises fine-tuning the grazing angle based on a measured intensity of a $SiK\alpha$ fluorescence line.

23. The method according to claim 21, and comprising determining the grazing angle from a stored calibration lookup table comprising the fluorescence intensity of the given spectral line as a function of angle of incidence.

24. The method according to claim 17, and comprising exciting X-ray fluorescence at multiple different X-ray energy bands, and detecting the X-ray fluorescence at respective multiple different X-ray energy bands.

25. The method according to claim 17, and comprising measuring X-rays that are specularly reflected by the sample at the grazing angle.

26. The method according to claim 17, and comprising recalibrating a zero-angle reference for the optical inclinometer based on the fine-tuning, and storing the calibrated zero-angle reference for later use at subsequent measurement sites on the sample or for use with subsequent samples.

27. The method according to claim 17, and comprising attenuating X-ray fluorescence radiation of progressively-increasing wavelengths emitted from a previous layer of a multi-layer shield comprising multiple layers.

28. A method for X-ray measurement, the method comprising:
generating and directing an X-ray beam to a surface of a sample;
measuring X-ray fluorescence radiation emitted from the sample in response to being excited by the X-ray beam; and
attenuating stray X-ray fluorescence radiation of progressively-increasing wavelengths emitted from a previous layer using a multi-layer shield comprising multiple layers.

29. The method according to claim 28, wherein attenuating the stray X-ray fluorescence comprises attenuating the X-ray fluorescence with a first layer of the multiple layers traversed by the X-ray beam, which is made of a light-weight metal, attenuating with a second layer traversed by the X-ray beam, which is made of a heavy-weight metal, attenuating with a third layer traversed by the X-ray beam, which is made of a medium-weight metal, and attenuating with a fourth layer traversed by the X-ray beam, which is made of a light-weight metal.

30. The method according to claim 28, wherein attenuating the stray X-ray fluorescence comprises mounting a plate comprising the multiple layers in front of a snout of an X-ray detector.

31. The method according to claim 28, wherein attenuating the stray X-ray fluorescence comprises protruding the multi-layer shield below a lowest point of a snout of the X-ray detector.

32. The method according to claim 28, and comprising:
measuring an inclination of the surface of the sample; and
based on the measured inclination, calibrating the grazing angle, and, based on the measured X-ray fluorescence, further fine-tuning the grazing angle.

* * * * *